United States Patent
Schräbler et al.

(10) Patent No.: US 8,074,507 B2
(45) Date of Patent: Dec. 13, 2011

(54) TIRE MODULE WITH PIEZOELECTRIC TRANSDUCER

(75) Inventors: Sighard Schräbler, Marben (DE); Kai Schade, Oberursel (DE); Stefan Kammann, Kelkheim (DE); Markus Neumann, Mannheim (DE); Wolfgang Käfer, Frankfurt (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 151 days.

(21) Appl. No.: 12/596,034

(22) PCT Filed: Apr. 8, 2008

(86) PCT No.: PCT/EP2008/054231
§ 371 (c)(1),
(2), (4) Date: Feb. 16, 2010

(87) PCT Pub. No.: WO2008/125549
PCT Pub. Date: Oct. 23, 2008

(65) Prior Publication Data
US 2010/0170332 A1  Jul. 8, 2010

(30) Foreign Application Priority Data

Apr. 16, 2007 (DE) .......... 10 2007 018 145
Mar. 5, 2008 (DE) .......... 10 2008 012 659

(51) Int. Cl.
*B60C 23/02* (2006.01)

(52) U.S. Cl. .................................. 73/146.5
(58) Field of Classification Search ............ None
See application file for complete search history.

(56) References Cited

U.S. PATENT DOCUMENTS

| 7,343,787 B2 * | 3/2008 | Oflaz .................. 73/146 |
| 7,631,554 B2 * | 12/2009 | Behrends et al. .......... 73/146.5 |
| 2005/0257609 A1 * | 11/2005 | Mancosu et al. ........... 73/146 |
| 2007/0205691 A1 | 9/2007 | Hattori et al. |
| 2008/0264537 A1 * | 10/2008 | Behrends et al. ......... 152/152.1 |
| 2010/0043541 A1 * | 2/2010 | Kobayakawa ............. 73/146 |
| 2010/0147061 A1 * | 6/2010 | Weston ................... 73/146 |
| 2011/0023592 A1 * | 2/2011 | Hortig et al. ............. 73/146.5 |

FOREIGN PATENT DOCUMENTS

| DE | 10 2004 031810 | 1/2006 |
| DE | 10 2005 000996 | 7/2006 |
| DE | 10 2005 062 872 | 3/2007 |
| EP | 1 796 251 | 6/2007 |
| JP | 11-041058 | 2/1999 |
| JP | 2006 054956 | 2/2006 |

* cited by examiner

*Primary Examiner* — Andre Allen
(74) *Attorney, Agent, or Firm* — RatnerPrestia

(57) ABSTRACT

Tire module for the detection of tire state quantities which includes a printed circuit board and a piezoelectric transducer with a housing and at least one transducer element, wherein the transducer element is coupled to piezoelectric material or consists of piezoelectric material, and wherein the piezoelectric transducer is executed as a surface-mounted device (SMD) and as such is mounted on the printed circuit board by terminal areas and is electrically connected to the printed circuit board.

14 Claims, 1 Drawing Sheet

US 8,074,507 B2

TIRE MODULE WITH PIEZOELECTRIC TRANSDUCER

CROSS-REFERENCE TO RELATED APPLICATIONS

This application is the U.S. national phase application of PCT International Application No. PCT/EP2008/054231, filed Apr. 8, 2008, which claims priority to German Patent Application No. DE 10 2007 018 145.2, filed Apr. 16, 2007 and German Patent Application No. DE 10 2008 012 659.4, filed Mar. 5, 2008, the contents of such applications being incorporated herein by reference.

FIELD OF THE INVENTION

The invention relates to a tire module and to the use thereof in a tire pressure monitoring system.

DESCRIPTION OF THE RELATED ART

Modern motor vehicles increasingly use apparatuses which provide early recognition of faults and malfunctions in various areas in the motor vehicle and report them to the driver. These include recording tire air pressure, for example, in order to avoids faults or accidents which can be attributed to an incorrectly adjusted tire air pressure. In many of the systems already used for this purpose, a respective tire module is arranged on each wheel, often inside each tire. A tire module usually comprises at least one sensor for recording a tire parameter, e.g. the tire air pressure and/or the tire temperature, and also a transmission unit and possibly an associated evaluation electronics unit. The electronic components can be supplied with electrical power by a battery, a microgenerator with a piezoelectric element or a transponder coil, for example. The various electrical and electronic components are usually arranged on a or a plurality of printed circuit boards.

DE 10 2004 031 810 A1 describes a system for producing electrical power with a piezoelectric element which is arranged inside a tire. In this case, the piezoelectric element is in the form of a cantilever or torsion element, for example.

DE 10 2005 000 996 A1 provides for a spring element of a tire module to be in the form of a bar spring, torsion spring or leaf spring. A free end of the spring element has a seismic mass arranged on it which has a pulse supplied to it as a result of the tire rolling. The bearing of the seismic mass on the spring element results in a spring/mass oscillator, which has an increased level of efficiency compared with conventional piezoelectric energy transducers. The oscillation is produced by virtue of the tire module moving on a straight path whenever it passes through the contact area during rolling, whereas it moves on a circular path after exiting the contact area. During the circular path, the centrifugal force acts on the seismic mass; it is ideally free of force in the contact area. The centrifugal force deflects the spring/mass oscillator and prompts it to attempt to return to its position of rest in the contact area. Overshoots and post-pulse oscillations result, which means that the seismic mass is also in motion during the phases of constant force, that is to say between the transitions. This is particularly beneficial for electrical power conversion.

In one development of the invention from DE 10 2005 000 996 A1, the spring element is clamped in a housing, and at least one piezoelectric element is coupled to the spring element in the direction of movement. The piezoelectric element converts the movement energy of the spring/mass oscillator into electrical power, which for its part can be forwarded to loads. Advantageously, piezoelectric elements are coupled to the spring element in each direction of movement of said spring element, so that electrical power can be obtained from both piezoelectric elements in both directions of deflection for an oscillation in the respective planes.

When a tire module with a microgenerator for supplying power is used which is fitted inside the tire, it is necessary to ensure that the microgenerator is in a form and connected to the other components of the tire module such that the microgenerator and the electrical and mechanical connects in the tire module withstand the loads at least throughout the life of the tire.

In the tire modules with microgenerators which are known per se from the prior art, the microgenerator and the printed circuit board are arranged and fitted separately from one another in the tire module. The electrical connection between the microgenerator and the printed circuit board is made as known from conventional electronic components by means of connecting wires. These are passed through component fitting holes in the printed circuit board and are soldered on the reverse of the printed circuit board (via). On account of the accelerations occurring in a tire, forces act on the connecting wires which can result in the connecting wires being torn.

From electronics, surface-mounted components (SMD components) are known per se which do not have any wire connections and are soldered directly on the surface of the printed circuit board by means of pads (surface mounting technology). This makes it possible to achieve a higher component density on the printed circuit board, but SMD components are more easily detached as a result of mechanical loading than wired components.

SUMMARY OF THE INVENTION

Against the background of this prior art, the invention relates to the object of providing an improved tire module for fitting inside a tire which comprises a printed circuit board and a piezoelectric microgenerator.

The invention achieves this object by means of the tire module described herein.

The invention relates to the notion of producing the piezoelectric microgenerator (piezoelectric transducer) in a tire module, which comprises a housing and a transducer element for converting movement energy into electrical power by means of piezoelectric material, as a surface-mounted component, also called SMD component (Surface Mounted Device), and arranging it directly on the printed circuit board.

The transducer element is preferably a spring element. This is made to oscillate by changes in acceleration, and the movement energy is converted into electrical power by means of piezoelectric material. The spring element can be arranged in a rigid housing or on a rigid printed circuit board without reducing the energy yield, so long as the spring element is mounted such that it is prompted to oscillate by changes in acceleration.

The spring element is expediently mounted such that it can make movements in one direction or else in two (to and fro) or more directions from the position of rest (when the spring element is stable in an equilibrium of forces). So that the spring element moves only in one direction, it is advantageously prevented from moving in the opposite direction by a stop.

It is preferred for the housing of the piezoelectric transducer to be fully closed in order to protect the interior of the piezoelectric transducer, such as the spring element and piezoelectric material, against damage, e.g. by moisture and/or soiling.

However, it is also preferred for the housing of the piezoelectric transducer to be open on one side or at one location. This makes it a simple matter for the spring element to be introduced into the housing through the open side or location when mounting the piezoelectric transducer.

Preferably, the piezoelectric transducer is electrically connected to the printed circuit board by two or three contact means. In this case, the contact means, which are particularly preferably connected to different locations of the piezoelectric material of the piezoelectric transducer inside the transducer, are routed out of the housing of the piezoelectric transducer and are then at least partly routed around the housing before being electrically connected to the printed circuit board. This achieves an improved hold for the housing on the printed circuit board.

In line with one preferred embodiment of the tire module according to aspects of the invention, the contact means are in contact with the housing in order to prevent the housing from striking or rubbing on the contact means.

It is likewise preferred for the contact means to be supple, metal contact lugs. This firstly provides the advantage that the contact means can be bent around the housing in close contact and hold it together by means of form locking. Secondly, in the case of two-dimensional contact means (contact lugs), the contact faces on the housing and hence the holding force are increased. This reduces the risk of rupture and therefore increases the robustness of the arrangement.

In line with a further preferred embodiment of the tire module according to aspects of the invention, the contact means, having been routed out of the housing of the piezoelectric transducer, are routed around the housing in different directions. The contact means end on the same side of the housing and/or directly next to one another and are electrically connected to the printed circuit board there as pads of the transducer. The housing is thus surrounded by the contact means and in this way held on the printed circuit board.

If the housing of the piezoelectric transducer is open on one side or at one location, the open side or location is preferably covered or sealed in part or in full by a contact means. Thus, the interior of the transducer, e.g. the spring element and piezoelectric material, is protected against damage.

In order to attain improved mechanical attachment of the housing of the piezoelectric transducer to the printed circuit board, one side or location of the housing is preferably additionally attached to the printed circuit board in a force-locking manner, e.g. by means of bonding. Particularly preferably this is the side or location at which the contact means end. The electrical and mechanical connection of the printed circuit board and the piezoelectric transducer are thus situated on the same side/at the same location, which increases durability, since tensions between various connecting points, e.g. in the event of shearing of the module, are avoided.

Preferably, the piezoelectric transducer is soldered on conductor tracks on the printed circuit board by means of solderable pads.

To protect the piezoelectric transducer and prevent damage/soiling on the piezoelectric transducer, e.g. as a result of solder material, the housing of the piezoelectric transducer, with the exception of the pads and/or the side which is connected to the printed circuit board by means of bonding, is preferably coated with solder resist. With particular preference, the contact means, with the exception of the pads, are also coated with solder resist in order to prevent unwanted soiling during the soldering process.

The spring element is preferably clamped only at one end in order to achieve a large-amplitude oscillation by the spring element (given a fixed length of the spring element). To increase the degree to which electrical power is obtained further, the free end of the spring element or the vicinity of the free end of the spring element particularly preferably has a seismic mass arranged on it.

The spring element clamped at one end is advantageously in the form of a bimorph (two piezoelectrically active layers) and is mounted such that it can oscillate on both sides in order to achieve the highest possible energy yield.

Alternatively, the spring element clamped at one end is loosely supported by the printed circuit board or by the housing. This allows the spring element to have free oscillatory movement only on one side, but the spring element is better protected from the support side. With particular preference, the spring element is in the form of a unimorph (one piezoelectrically active layer), since this makes it less sensitive to damage and means that it can be produced less expensively. However, the energy yield for the same physical volume and equivalent stimulation is lower than in the case of the embodiment which can oscillate on both sides.

Alternatively, the spring element is preferably clamped at two ends, and the seismic mass is arranged in the region of the center of the spring element.

One advantage of the invention is that the printed circuit board and the microgenerator form a unit, and relative forces which occur when the printed circuit board and the microgenerator are arranged/attached separately are minimized. It should thus also be explained that the mechanical robustness of surface mount technology is sufficient for connecting the printed circuit board and the microgenerator in a tire module. A further advantage of the invention is that the piezoelectric transducer fitted on the printed circuit board using SMD technology does not require any long connecting wires between the printed circuit board and the transducer which are at risk of rupture in the tire module. The tire module according to aspects of the invention does have a longer life in comparison with tire modules from the prior art.

The invention also relates to the use of the tire module in a tire pressure monitoring system.

Preferably, the tire module according to aspects of the invention is used in a tire monitoring system which comprises a central evaluation unit and at least one tire module, said tire module(s) being connected to the evaluation unit by means of wireless transmission technology. The electrical power obtained by the piezoelectric transducer in the tire module according to aspects of the invention is preferably used for sending and/or receiving data to and/or from the evaluation unit. In addition, the electrical power is preferably used for operating sensors in a tire module for the purpose of ascertaining tire state variables.

BRIEF DESCRIPTION OF THE DRAWINGS

Further preferred embodiments of the invention can be found in the description which follows with reference to figures, in which FIG. 1 schematically shows a printed circuit board and a piezoelectric transducer in a first tire module based on an example, and FIG. 2 schematically shows a printed circuit board and a piezoelectric transducer in a second tire module based on an example.

DETAILED DESCRIPTION OF THE PREFERRED EMBODIMENTS

Figure 1:
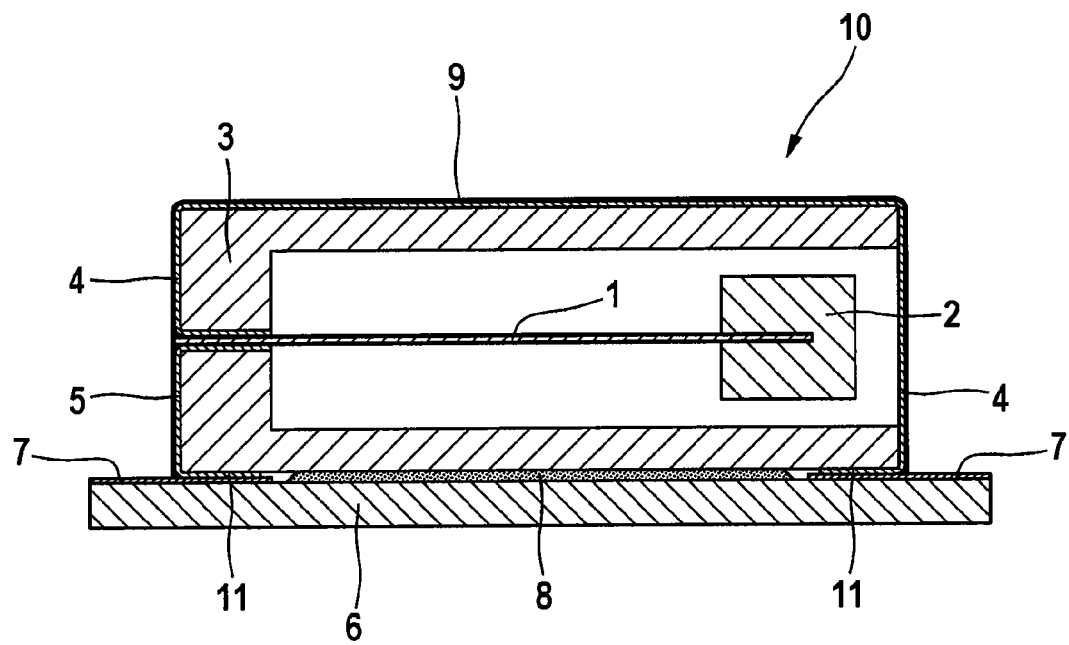

FIG. 1 schematically shows a printed circuit board 6 holding a piezoelectric transducer (microgenerator) 10 from a first tire module based on an example. The contact between the piezoelectric transducer 10 and the printed circuit board 6 is made in the form of an SMD component. To this end, the microgenerator 10 is fitted directly on the printed circuit board 6, and the pads 11 of the microgenerator 10 are electrically connected to the conductor tracks 7 on the printed circuit board 6.

By way of example, the piezoelectric transducer 10 comprises a bimorph cantilever 1 (piezo cantilever) with two piezoelectrically active material layers). The cantilever 1 is a spring element which is stimulated into oscillation by changes in acceleration. The cantilever 1 is clamped at one end in the housing 3 of the piezoelectric transducer 10. At the other end of the cantilever 1, a seismic mass 2 is arranged.

The bimorph cantilever 1 (piezo cantilever) inside the microgenerator 10 is connected to supple metal contact lugs 4, 5. The contact lugs 4, 5 peer out from the injection-molded housing 3 of the microgenerator 10 (left-hand side in FIG. 1), are angled off in the opposite direction (in FIG. 1: contact lug 4 upward, contact lug 5 downward) and are bent around the housing 3. The contact lugs 4, 5 both end on the same side of the housing 3 (lower side in FIG. 1). There, they are bonded to the housing 3, so that the solder contacts 11 are produced on the underside for the purpose of connection to conductor tracks 7 on the printed circuit board 6.

As a result of the contact lugs 4, 5 surrounding the housing 3, the housing 3 as a whole is held on the printed circuit board 6 by the contact lugs 4, 5 after the microgenerator 10 has been soldered onto the printed circuit board 6. This results in robust attachment of the microgenerator 10 to the printed circuit board 6. By way of example, the bimorph cantilever 1 is connected to supple metal contact lugs 4, 5 in the actual production process (e.g. by means of welding, soldering or bonding).

To increase the detaching force, the microgenerator 10 has its underside, for example, additionally bonded to the printed circuit board 6 for the soldering process (adhesive fixing 8).

The housing 3 based on the example is open on one side (right-hand side in FIG. 1). The upper contact lug 4 seals the open side of the housing 3 against harmful environmental influences.

So that the metal contact lugs 4, 5 do not take on tin at unwanted locations during the soldering process, the outer contour of the piezoelectric transducer 10, for example, with the exception of the contacts 11, is protected by solder resist 9.

An advantage of the arrangement based on the example is that in this way a compact and self-contained system is obtained.

The piezo cantilever 1 based on the example comprises a support layer and two layers comprising piezoelectric material (bimorph). The support layer may be a fiberglass-reinforced epoxy resin plate (FR4 or FR5), a metal support layer or may comprise carbon, fiberglass or ceramic, for example. Besides the exemplary arrangement as a bimorph, other arrangements are also conceivable, for example as a trimorph (three piezoelectrically active layers), a multimorph (more than two piezoelectrically active layers) or a unimorph (one piezoelectrically active layer). The piezoelectric material may be piezoceramic materials or piezo film (e.g. polyvinylidene fluoride, PVDF). The piezoelectric ceramic may be in the form of lead zirconate titanate (PZT).

Besides the exemplary piezoelectric transducer 10 from FIG. 1, with a spring element 1 clamped at one end, other spring element variants are also conceivable, e.g. a spring element clamped at two ends with a seismic mass in the center (not shown in a figure).

In line with another exemplary embodiment (not shown), the bimorph cantilever 1 inside the microgenerator 10 is connected to more than two, e.g. three, supple metal contact lugs which peer out from the injection-molded housing of the microgenerator and tap off potentials at different points of the transducer element. The third contact lug corresponds to a central electrode (e.g. ground connection), for example. This allows a subsequent evaluation circuit, e.g. for determining the contact area length from the signal from the microgenerator, to be designed using fewer electronic components.

Figure 2:
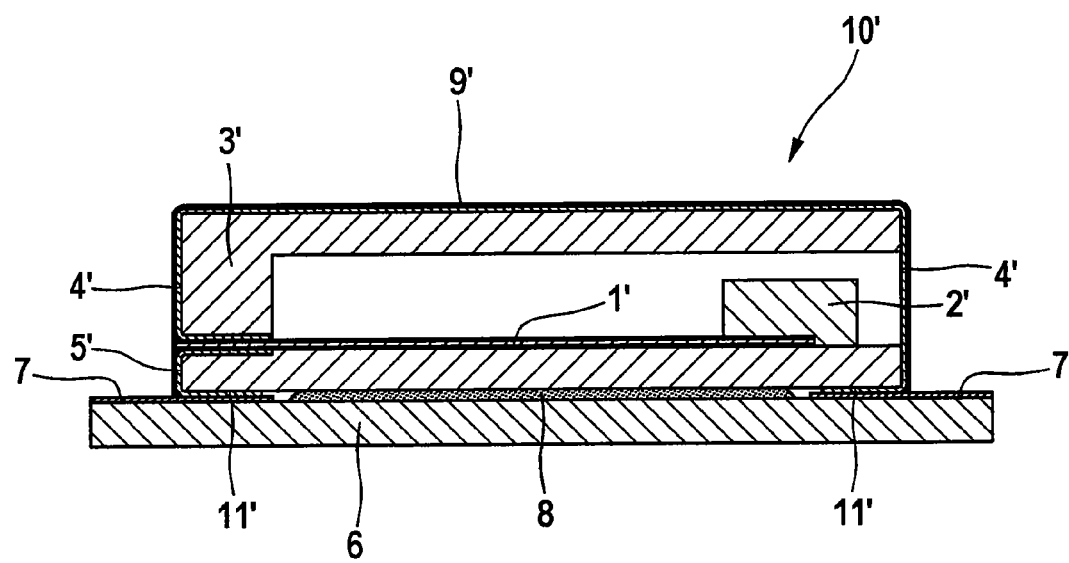

FIG. 2 schematically shows a printed circuit board 6 holding a piezoelectric transducer (microgenerator) 10' from a second tire module based on an example. The contact between the piezoelectric transducer 10' and the printed circuit board 6 is made in the form of SMD component. To this end, the microgenerator 10' is fitted directly on the printed circuit board 6, and the pads 11' of the microgenerator 10' are electrically connected to the conductor tracks 7 on the printed circuit board 6.

In line with the example, the piezoelectric transducer 10' comprises a unimorph cantilever 1' (piezo cantilever with one piezoelectrically active material layer). The cantilever 1' is a spring element which is stimulated into oscillation by changes in acceleration. The cantilever 1' has one end clamped in the housing 3' of the piezoelectric transducer 10'. At the other end of the cantilever 1', a seismic mass 2' is arranged. The cantilever 1' has one side (bottom in FIG. 2) resting loosely on the housing 3'. This means that the cantilever 1' is only able to oscillate freely in one direction (upward in FIG. 2).

Aside from the design of the piezo cantilever, the piezoelectric transducer 10' from FIG. 2 essentially corresponds to the piezoelectric transducer 10 from FIG. 1. The unimorph cantilever 1' is likewise connected inside the microgenerator 10' to supple metal contact lugs 4', 5' which peer out from the injection-molded housing 3' of the microgenerator 10' and surround the housing 3'. The variant embodiments described above with reference to the first exemplary embodiment can be transferred accordingly to the second exemplary embodiment.

In line with a further exemplary embodiment—not shown—the tire module furthermore also comprises a transmission unit and/or a reception unit for data interchange with a central unit, and also a pressure sensor and a temperature sensor. The piezoelectric transducer 10, 10' is used as a power generator for the electronic components and sensors and/or as a sensor, e.g. for determining contact area length.

If a microgenerator 10, 10' for supplying power to electronics in the tire, such as an electronic component, is intended to be mounted on a board 6, it is advantageous to make use of the acceleration as a stimulating force. For systems with little installation space, meaningful use can be made of the piezoelectric effect, in particular. With the high levels of acceleration of up to 5000 g at 45 Hz which act on a module on the inner liner of a tire when passing through the contact area, the use of cables is disadvantageous. At the same time, the microgenerator 10 should be mounted such that it does not detach from the board 6.

The tire module based on the invention is suitable for ascertaining tire state variables with an energy-self-sufficient system.

The invention claimed is:

1. A tire module for recording tire state variables which comprises a printed circuit board and a piezoelectric transducer having a housing and at least one transducer element, wherein the transducer element is coupled to piezoelectric material or comprises piezoelectric material, wherein the piezoelectric transducer is in the form of a surface-mounted component and is fitted on the printed circuit board and electrically connected to the printed circuit board by pads.

2. The tire module as claimed in claim 1, wherein the piezoelectric material of the piezoelectric transducer is electrically connected to the printed circuit board by at least two contacts, wherein the contacts lead from the housing of the piezoelectric transducer and are at least partially routed around the housing such that the housing is held on the printed circuit board by the contacts and ends of the contacts are electrically connected to the printed circuit board as the pads of the transducer.

3. The tire module as claimed in claim 2, wherein the contacts are routed around the housing in different directions and are electrically connected to the pads of the printed circuit board.

4. The tire module as claimed in claim 2, wherein the contacts are in contact with the housing.

5. The tire module as claimed in claim 4, wherein the contacts and the housing are connected in a form-locking manner.

6. The tire module as claimed in claim 1, wherein the housing of the piezoelectric transducer is additionally connected to the printed circuit board in a force-locking manner.

7. The tire module as claimed in claim 6, wherein the housing of the piezoelectric transducer is bonded to the printed circuit board on one side of the printed circuit board or at one location on the printed circuit board.

8. The tire module as claimed in claim 7, wherein the housing of the piezoelectric transducer is bonded to the printed circuit board at a location where the contacts end.

9. The tire module as claimed in claim 2, wherein the contacts are metal contact lugs.

10. The tire module as claimed in claim 2, wherein the housing of the piezoelectric transducer is open on at least one side or at at least one location, and at least one contact covers or seals an open side, or a location, either at least in part or in full.

11. The tire module as claimed in claim 2, wherein the housing of the piezoelectric transducer and the contacts are coated with solder resist.

12. The tire module as claimed in claim 11, wherein the pads and a side of the housing that is connected to the printed circuit board are not coated with solder resist.

13. The tire module as claimed in claim 1, wherein the transducer element is a spring element.

14. The use of a tire module as claimed in claim 1 in a tire monitoring system.

* * * * *